United States Patent [19]
Keown et al.

[11] Patent Number: 5,289,056
[45] Date of Patent: Feb. 22, 1994

[54] BICMOS INPUT BUFFER CIRCUIT WITH INTEGRAL PASSGATE

[75] Inventors: Susan M. Keown, Portland; Roy L. Yarbrough, Hiram, both of Me.

[73] Assignee: National Semiconductor Corporation, Santa Clara, Calif.

[21] Appl. No.: 898,029

[22] Filed: Jun. 12, 1992

[51] Int. Cl.$^5$ .............................................. H03K 17/04
[52] U.S. Cl. .................................... 307/446; 307/443; 307/475
[58] Field of Search ............... 307/443, 446, 473, 475, 307/570

[56] References Cited

U.S. PATENT DOCUMENTS

| | | | |
|---|---|---|---|
| 5,006,732 | 4/1991 | Nakamura | 307/473 |
| 5,051,623 | 9/1991 | Yarbrough et al. | 307/473 |
| 5,070,201 | 12/1991 | Ten Eyck | 307/446 X |
| 5,107,142 | 4/1992 | Bhamidipaty | 307/446 |

Primary Examiner—David R. Hudspeth
Attorney, Agent, or Firm—Daniel H. Kane; Richard C. Calderwood; Stephen R. Robinson

[57] ABSTRACT

A BICMOS input buffer circuit (20) incorporates an integral CMOS passgate circuit (P2,N2) between bipolar input (Q1) and output (Q3,Q4,Q5) transistors of the input buffer circuit. Latch enable inputs (LE) receive latch enable signals for operating the input buffer circuit and internal passgate in a transparent mode for passing data signals from the input ($V_{IN}$) to the output ($V_{OUT}$) and in a blocking mode for blocking data signals. The internal CMOS passgate circuit (P2,N2) is coupled into the input buffer circuit (20) to control nodes of the transistor output pullup (Q4,Q5) and pulldown (Q3) for controlling the conducting states of the respective transistor output pullup and pulldown to implement the blocking and transparent modes. A third passgate transistor (P3) may also be coupled between a control node (m1) of the transistor output pullup (Q4,Q5) and the low potential power rail (GND) for positive turn off of the output pullup. A dynamic power enhancement circuit (DPC) provides transient enhancement for the transition from the blocking mode to transparent mode.

15 Claims, 3 Drawing Sheets

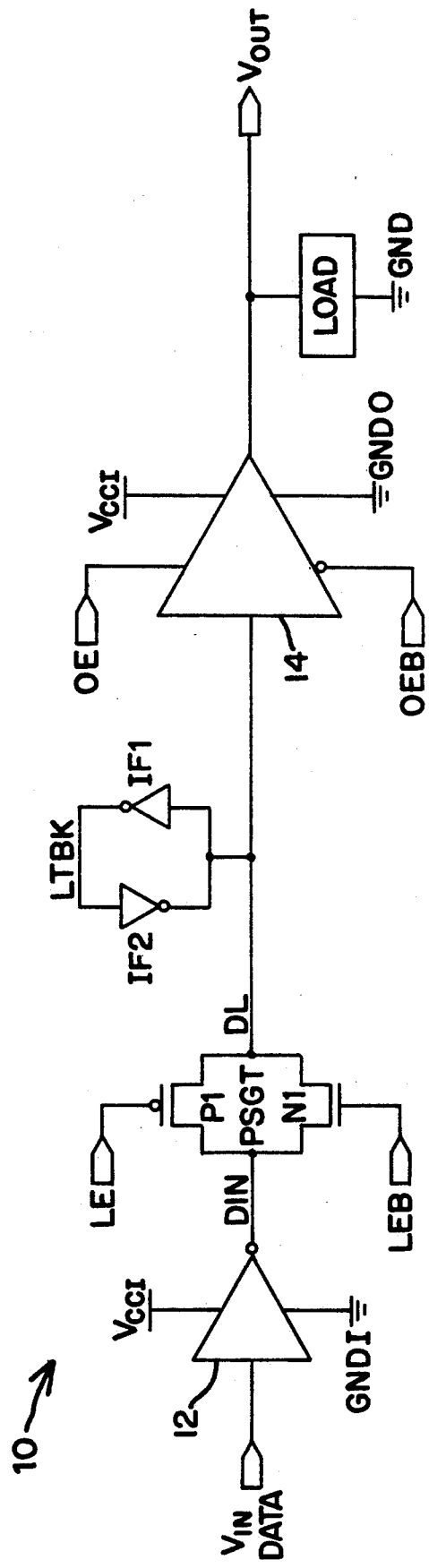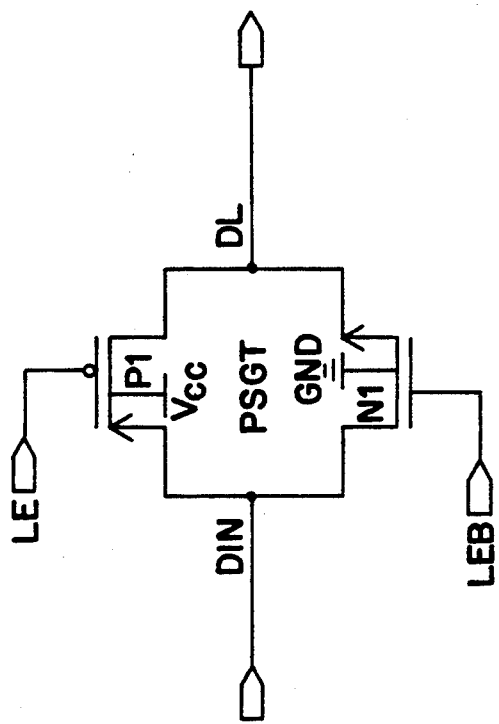
FIG 1 (PRIOR ART)
FIG 3 (PRIOR ART)

BICMOS INPUT BUFFER CIRCUIT WITH INTEGRAL PASSGATE

CROSS REFERENCE TO RELATED PATENT APPLICATIONS

This invention is related to the following U.S. patent applications. The Susan M. Keown and Roy L. Yarbrough U.S. patent application Ser. No. 796,455, filed Nov. 20, 1991 for BICMOS TTL OUTPUT BUTTER CIRCUIT WITH REDUCED POWER DISSIPATION, now U.S. Pat. No. 5,218,243 issued Jun. 8, 1993, introduces CMOS phase splitter transistors into essentially bipolar TTL output buffer circuits. The Michael G. Ward U.S. patent application Ser. No. 684,043 filed Apr. 11, 1991 for HIGH SPEED PASSGATE, LATCH, AND FLIP-FLOP CIRCUITS, now U.S. Pat. No. 5,132,577, issued Jul. 21, 1992, describes a BICMOS passgate circuit with transient enhancement of CMOS passgate and latch transistors and stages using bipolar transistors. The James R. Ohannes et al. U.S. patent application Ser. No. 804,105 filed Dec. 6, 1991 for BICMOS OUTPUT BUFFER CIRCUIT WITH CMOS DATA PATHS AND BIPOLAR CURRENT AMPLIFICATION described other BICMOS output buffer circuits integrating CMOS and bipolar transistor elements and functions. Other related patent applications are also referred to in U.S. patent application Ser. No. 804,105.

TECHNICAL FIELD

This invention relates to a new input buffer circuit having an integral passgate incorporated into the buffer circuit. The internal passgate controls transfer of data signals through the input buffer circuit to the next stage. The invention permits passgate operation of the input buffer circuit with lower power into a lower impedance at the output and with faster rising and falling edge rates and reduces delay.

BACKGROUND ART

A conventional buffer circuit configuration 10 is illustrated in FIG. 1. An inverting input buffer circuit 12 coupled between high and low potential power rails $V_{CCI}$, GNDI receives input data signals of logic high and low potential levels at the input $V_{IN}$. The input buffer circuit 12 drives a passgate circuit PSGT which transmits data signals or blocks transfer of data signals from the passgate input DIN to the passgate output DL depending on the signals at the passgate enable or latch enable inputs LE,LEB. Operation of the conventional passgate circuit PSGT is described below with reference to FIG. 3.

A data signal at the output DL of passgate PSGT is latched by latchback circuit LTBK consisting of feedback coupled inverters IF1, IF2 and provides the input to the final output buffer circuit 14. Output buffer circuit 14 is a tristate output buffer circuit coupled between high and low potential power rails $V_{CCI}$,GND0 for driving the final output $V_{OUT}$ and any load capacitance LOAD. Complementary tristate enable signal inputs OE,OEB are provided to implement the high impedance third state or tristate at the output. Such an output buffer circuit is described for example in U.S. patent application Ser. No. 796,455 referred to above.

The conventional passgate circuit PSGT following the input buffer circuit 12 is shown in further detail in FIG. 3. The passgate circuit is formed by CMOS transistors P1,N1 having primary current paths coupled in parallel. The control gate nodes of parallel coupled CMOS transistors P1,N1 are coupled respectively to complementary latch enable inputs LE,LEB. With complementary signals LE high and LEB low, neither CMOS transistor is conducting and the passgate PSGT is in the blocking mode blocking transfer of data signals from passgate input DIN to passgate output DL. With complementary signals LE low and LEB high, both CMOS transistors P1,N1 are conducting in the transparent mode for transfer of data signals.

A disadvantage of the conventional buffer circuit configuration 10 and passgate PSGT of FIGS. 1 and 3 is that current drive at the output of input buffer circuit 12 is limited by the passgate impedance. The passgate impedance introduces a propagation delay or time shift $\Delta T$ for data signals passing from the input DIN to the output DL and limits the edge rate for both the falling and rising edges of the data signals. A conventional approach to overcoming the time shift $\Delta T$ is to increase the power of the input buffer circuit 12. This power level may be limited by the circuit specifications however and the problem of undesirable power dissipation also arises.

In order to reduce the impedance of the passgate PSGT, large transistors P1,N1 may be used but this increases the capacitance of the "load" at the output of the input buffer circuit 12. The RC time constant of the passgate continues to adversely effect rising and falling edge rates during transfer of data signals.

A conventional bipolar input buffer circuit 12 is illustrated in further detail in FIG. 2. The example of FIG. 2 is an inverting input buffer circuit delivering low and high potential level output signals at the output $V_{OUT}$ in response to high and low potential level data signals at the input $V_{IN}$. The output pullup and pulldown transistors are bipolar transistors. The Darlington transistor output pullup Q4,Q5 sources current to the output $V_{OUT}$ from the high potential power rail $V_{CCI}$. The bipolar transistor output pulldown Q3 is a high current drive transistor element for sinking current from the output $V_{OUT}$ to the low potential power rail GND. A bipolar transistor phase splitter Q2 controls the conducting states of the respective output transistor pullup and pulldown in opposite phase in response to data signals at the input $V_{IN}$.

The input $V_{IN}$ is coupled to the base node of phase splitter transistor Q2 through diode D1 for logic low potential level input data signals. For high potential level data signals, the input $V_{IN}$ turns on input transistor Q1 for providing base drive current through resistors R1 and R2 to the base node of transistor phase splitter Q2. The base node of input transistor Q1 is coupled to the input $V_{IN}$ through isolating PNP input transistor QP1.

With a high potential level signal at the input $V_{IN}$ phase splitter transistor Q2 is conducting and turns on the transistor output pulldown Q3. Discharge current passes from the output $V_{OUT}$ and through discharge paths R5,SD3 and SD2 to accelerate turn off of the transistor output pullup Q4,Q5 and turn on of the transistor output pulldown Q3. The transistor phase splitter Q2 is coupled to the high potential power rail $V_{CCI}$ through collector resistor R3 and discharges the base and turns off pullup transistor Q4. A low potential level output signal appears at the output $V_{OUT}$.

With a low potential level data signal at the input $V_{IN}$, the transistor phase splitter Q2 turns off and the base of transistor output pulldown Q3 is discharged through the "poor man" squaring network SD5,R4. An AC Miller killer circuit (ACMK) prevents turn on of the output pulldown transistor Q3 during the transition from low to high potential level at the output $V_{OUT}$. The AC Miller killer circuit Q9,SD6,SD4,D2 is coupled to the base node of output pulldown transistor Q3 to divert capacitive feedback Miller current, a parasitic current that may pass from the collector mode to base of Q3 through the internal Schottky diode clamp during charging of output load capacitance and transition from low to high potential level at the output $V_{OUT}$. The ACMK discharges the parasitic feedback Miller current to the low potential power rail GND. At the same time the transistor output pullup Q4,Q5 turns on sourcing current and establishes a high potential level output signal at the output $V_{OUT}$.

A capacitor coupled transistor CQ6 may be coupled in the discharge path SD1,R7 at the base node of transistor phase splitter Q2 to control the LH edge at the input by slowing down the switching of the phase splitter. It is the output $V_{OUT}$ of input buffer circuit 12 that drives the passgate PSGT as shown in FIG. 1.

OBJECTS OF THE INVENTION

It is an object of the present invention to provide a new buffer circuit configuration with passgate control in which the input buffer circuit is not limited by the impedance of a passgate coupled to the output.

Another object of the invention is to provide an improved buffer circuit configuration with passgate control of the input buffer circuit which operates with lower power requirements, reduced propagation delay, and increased edge rates for both falling and rising edges.

A further object of the invention is to provide an input buffer circuit having passgate control with enhanced speed of transition from the blocking to transparent modes.

DISCLOSURE OF THE INVENTION

In order to accomplish these results the invention provides a BICMOS input buffer circuit having bipolar input and output transistors coupled respectively to an input and output. According to the invention a CMOS passgate circuit is coupled and incorporated into the input buffer circuit between the bipolar input and output transistors providing a BICMOS input buffer circuit with integral internal passgate. Latch enable inputs are provided for operating the input buffer circuit and integral internal passgate in transparent and blocking modes according to the latch enable signals at the latch enable inputs.

In the preferred example, the CMOS passgate circuit is coupled into the input buffer circuit to control nodes of the transistor output pullup and pulldown. The CMOS passgate circuit controls the conducting states of the respective transistor output pullup and pulldown to implement the blocking and transparent modes.

A first passgate transistor is coupled between the high potential power rail and a control base node of the output transistor pullup. The control gate node of the first passgate transistor is coupled to a first latch enable signal input. A second passgate transistor is coupled between a control node of the output transistor pulldown and the low potential power rail. The control gate node of the second passgate transistor is coupled to a second latch enable signal input. For an LE signal high in the blocking mode, the first passgate transistor is not conducting, isolating the transistor output pullup from the high potential power rail. The second passgate transistor is conducting, coupling the base node of the transistor output pulldown to ground potential. For an LE signal low in the transparent mode, the first passgate transistor is conducting coupling the control base node of the transistor output pullup to the high potential power rail. The second passgate transistor is nonconducting blocking the path from the base node of the transistor output pulldown to the low potential power rail.

The integral passgate circuit may also include a third passgate transistor coupled between a control node of the output transistor pullup and the low potential power rail. The control gate node of the third passgate transistor is coupled to a third latch enable input for controlling the conducting state of the third passgate transistor in opposite phase from the first passgate transistor. The third passgate transistor is conducting in the blocking mode for positive turn off of the transistor output pullup.

The invention also provides a dynamic power enhancement circuit coupled to the input buffer circuit and internal passgate to provide transient enhancement of transition from the blocking mode to transparent mode at the output. The dynamic power enhancement circuit is coupled between the high potential power rail and the input transistor for transient enhancement of base drive current from the input transistor to the transistor phase splitter.

Other objects, features and advantages of the invention are apparent in the following specification and accompanying drawings.

BRIEF DESCRIPTION OF THE DRAWINGS

FIG. 1 is a schematic block diagram of a conventional buffer circuit configuration showing an input buffer circuit, passgate, latchback, and output buffer circuit coupled in sequence.

FIG. 3 is a schematic block diagram of a prior art passgate circuit.

DESCRIPTION OF PREFERRED EXAMPLE EMBODIMENTS AND BEST MODE OF THE INVENTION

Figure 2:
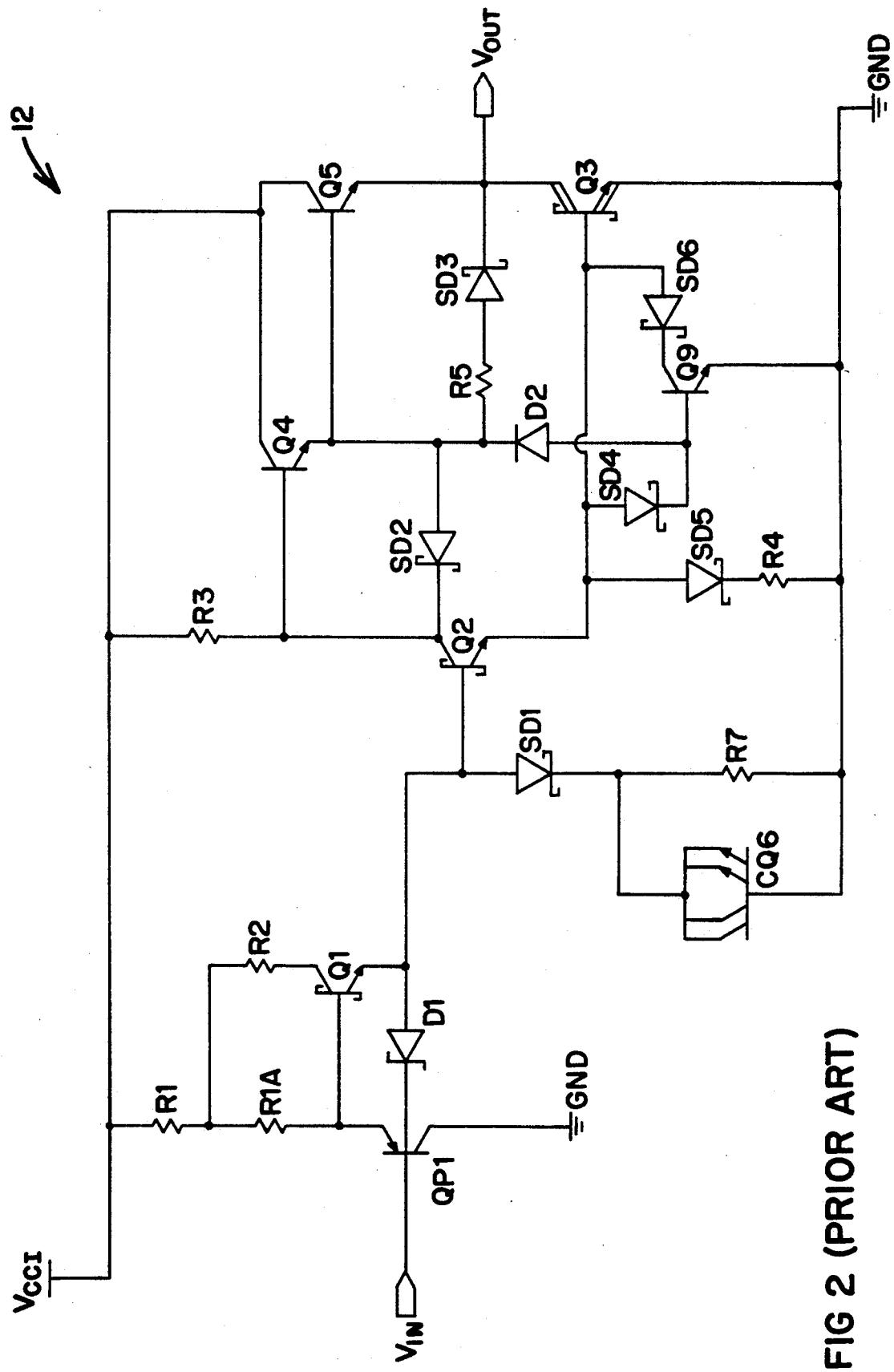
FIG. 2 is a detailed schematic circuit diagram of a prior art input buffer circuit.
Figure 4:
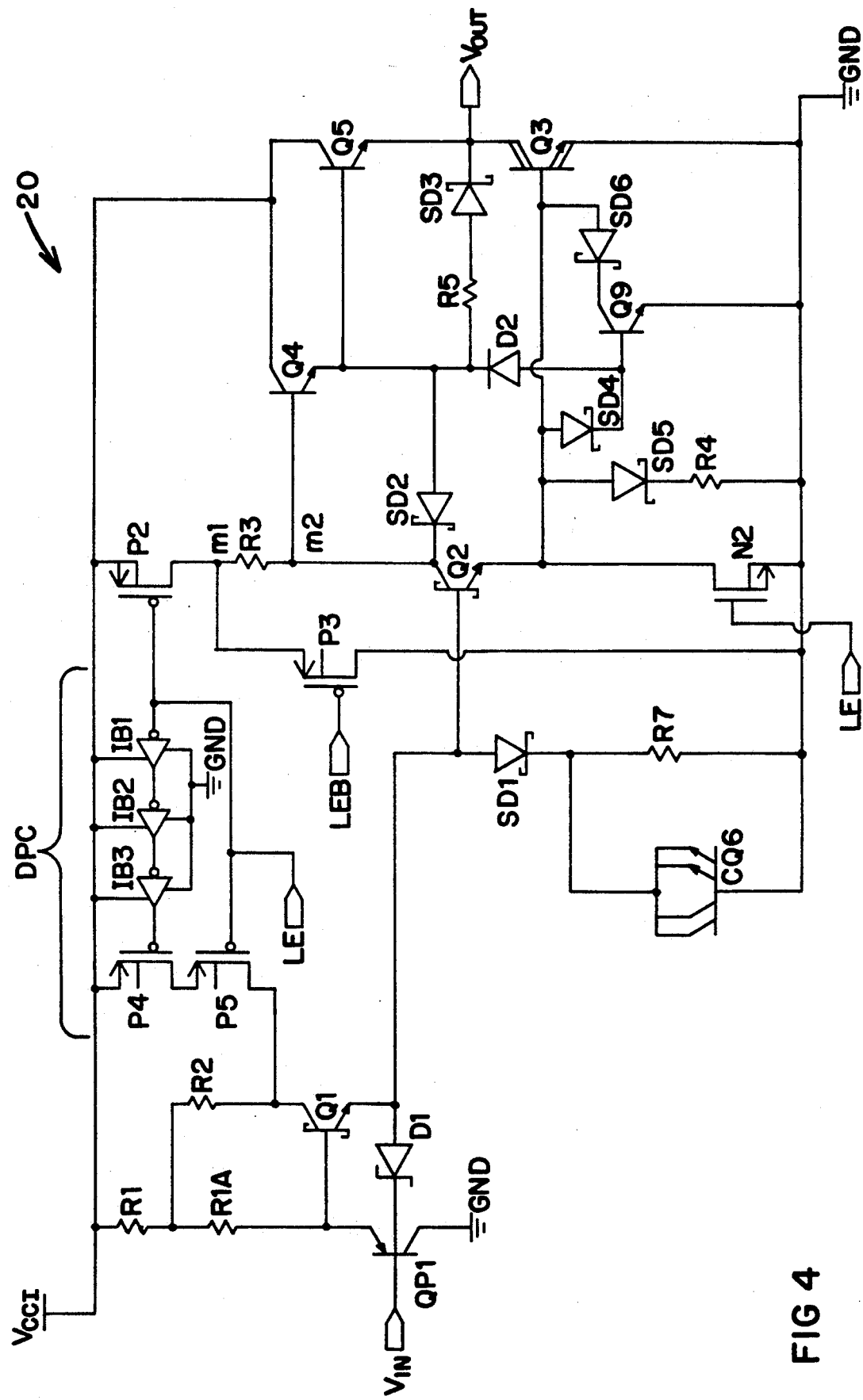
FIG. 4 is a schematic circuit diagram of the new input buffer circuit with integral passgate according to the invention.

An input buffer circuit 20 incorporating an internal passgate according to the invention is illustrated in FIG. 4. Circuit components performing the same or similar circuit functions as in the input buffer circuit of FIG. 2 are indicated by the same reference designations. In addition a PMOS first passgate transistor P2 is coupled with its primary current path between the high potential power rail $V_{CCI}$ and a control node mi for the bipolar transistor output pullup Q4,Q5. The first control node m1 is separated from the base node m2 of output pullup transistor Q4 by a passgate resistor R3. This circuit arrangement reduces the capacitance at node m2 which must be discharged by the phase splitter Q2 in order to turn off output pullup transistor Q4. The control gate node of the first passgate transistor P2 is coupled to latch enable input LE.

An NMOS second transistor N2 is coupled with its primary current path between the control base node of output pulldown transistor Q3 and the low potential power rail GND. The control gate node of the second passgate transistor N2 is also coupled to the latch enable bus input LE.

For an LE low potential level signal, the input buffer circuit 20 is operating in the transparent mode in a manner similar to the input buffer circuit 12 of FIG. 2. The first passgate transistor P2 is conducting coupling the control node m1 and base node m2 of output pullup transistor Q4 to the high potential level power rail $V_{CCI}$. At the same time the second passgate transistor N2 is not conducting, blocking the path to ground GND from the base node of output pulldown Q3. In the transparent operating mode data signals at the input $V_{IN}$ are transferred through with inversion to the output $V_{OUT}$.

With an LE high potential level signal at the LE bus inputs, the input buffer circuit 20 operates in the blocking mode. The first passgate transistor P2 is not conducting, isolating the control node m1 and base node m2 of output pullup transistor Q4 from the high potential power rail $V_{CCI}$. At the same time the second passgate transistor N2 is conducting connecting the base node of output pulldown transistor Q3 to the low potential power rail GND. As a result data signals at the input $V_{IN}$ are blocked and cannot be transferred to the output $V_{OUT}$.

Referring to FIG. 1, the buffer circuit configuration 10 is modified according to the present invention to the extent that the separate passgate circuit PSGT has been eliminated by incorporation directly into the input buffer circuit. The last signal at the output of the input buffer circuit during the transparent operating mode is held by the latchback circuit LTBK for the duration of the subsequent blocking mode of operation of the input buffer circuit. The signal held by latchback circuit LTBK remains the input to the final output buffer circuit 14.

Referring again to the input buffer circuit of FIG. 4, a PMOS third passgate transistor P3 may be coupled with primary current path between the control node m1 and the low potential power rail GND. The control gate node of the third passgate transistor P3 is coupled to the complementary latch enable input LEB which applies an LEB signal of opposite phase from the latch enable signals at inputs LE. The third passgate transistor P3 is therefore controlled in opposite phase from the first passgate transistor P2. When the first passgate transistor P2 is conducting during the transparent operating mode, the third passgate transistor P3 is not conducting blocking the path to ground from control node m1. During the blocking mode when the first passgate transistor P2 is not conducting, the third passgate transistor P3 is conducting, discharging the control node m1 and base node m2 of output pullup transistor Q4. The advantage of the third passgate transistor P3 is that it prevents noise problems at control nodes m1,m2 with positive turn off of the output pullup transistor Q4.

The input buffer circuit 20 of FIG. 4 also provides a dynamic power circuit DPC which provides a transient boost or transient enhancement for return of the input buffer circuit 20 from the blocking mode to the transparent mode of operation. The dynamic power circuit is provided by PMOS first and second DPC transistors P4,P5 having primary current paths coupled in series between the high potential power rail $V_{CCI}$ and the collector node of input transistor Q1. The control gate node of the second DPC transistor P5 is coupled directly to the latch enable input LE. The control gate node of the first DPC transistor P4 is coupled to the latch enable input LE through an inverting delay stage circuit provided by series coupled inverting buffers IB1,IB2,IB3.

For a transition of the input buffer circuit 20 from the blocking mode to transparent mode of operation the latch enable signal at the LE inputs undergoes a transition from high to low potential level. During the preceding LE high condition of the blocking mode, the second DPC transistor P5 is not conducting while the first DPC transistor P4 is conducting as a result of the inversion of the LE signal performed by the inverting delay stage circuit IB1,IB2,IB3.

Upon transition from LE high to LE low, the second DPC transistor P5 becomes conducting and the surge of current through DPC transistors P4,P5 enhances the collector to emitter current of input transistor Q1 if a high potential level data signal is present at the input $V_{IN}$. Input transistor Q1 therefore provides enhanced base drive current to phase splitter Q2 for accelerated turn on of transistor output pulldown Q3 providing an inverted low potential level data signal at the output $V_{OUT}$. The enhancement of base drive current through the input buffer circuit 20 lasts for the transient duration of the LE signal propagation delay through the three inverter buffer stages IB1,IB2,IB3 after which the first DPC transistor P4 turns off. The dynamic power circuit DPC therefore provides transient enhancement during the transition from the blocking to transparent mode for the condition of a high potential level data signal at the input $V_{IN}$.

While the invention has been described with reference to particular example embodiments it is intended to cover all modifications and equivalents within the scope of the following claims.

We claim:

1. A BICMOS input buffer circuit having bipolar input and output transistors coupled respectively to an input and an output to deliver high and low potential level output signals at the output in response to data signals at the input, comprising:

a CMOS passgate circuit incorporated into the input buffer circuit between the bipolar input and output transistors, said CMOS passgate circuit comprising latch enable inputs for operating the input buffer circuit and integral passgate circuit in a transparent mode for passing data signals from the input to the output and in a blocking mode for blocking transfer of data signals according to latch enable signals at the latch enable signal inputs;

and a dynamic power enhancement circuit (DPC) coupled to the input buffer circuit and CMOS passgate circuit said DPC being constructed to provide transient enhancement of base drive current to enhance transition from the blocking mode to transparent mode at the output of the BICMOS input buffer circuit.

2. The BICMOS output buffer circuit of claim 1 wherein the bipolar output transistors comprise a transistor output pullup coupled for sourcing current to the output from a high potential power rail and a transistor output pulldown coupled for sinking current to a low potential power rail from the output, and wherein the CMOS passgate circuit is coupled to control nodes of the transistor output pullup and pulldown for controlling the conducting states of the respective transistor output pullup and pulldown to implement said blocking and transparent modes.

3. The BICMOS input buffer circuit of claim 2 wherein the passgate circuit comprises a first passgate transistor coupled between the high potential power rail and a control node of the output transistor pullup, said first passgate transistor having a control gate node coupled to a first latch enable signal input, and a second passgate transistor coupled between a control node of the output transistor pulldown and low potential power rail, said second passgate transistor having a control gate node coupled to a second latch enable signal input.

4. The BICMOS input buffer circuit of claim 3 wherein the CMOS passgate circuit comprises a third passgate transistor coupled between a control node of the output transistor pullup and the low potential power rail, said third passgate transistor having a control gate node coupled to a third latch enable input for controlling the conducting state of the third passgate transistor in opposite phase form the first passgate transistor.

5. The input buffer circuit of claim 1 wherein the input buffer circuit comprises a transistor phase splitter coupled to control the conducting states of the respective transistor output pullup and pulldown, said bipolar input transistor being coupled to control the transistor phase splitter, said DPC being coupled between a high potential power rail and the input transistor for transient enhancement of base drive current from the input transistor to the transistor phase splitter during a transition from the blocking mode to the transparent mode.

6. The BICMOS input buffer circuit of claim 1 wherein the dynamic power enhancement circuit (DPC) comprises first and second DPC transistors with primary current paths coupled in series between the high potential power rail and a primary current path of the input transistor, said second DPC transistor having a control node coupled to a latch enable input, and said first DPC transistor having a control node coupled to the latch enable input through an inverting delay stage circuit for operating the first and second DPC transistors in opposite phase with a specified signal propagation delay between turn on of the second DPC transistor and turnoff of the first DPC transistor.

7. The BICMOS input buffer circuit of claim 4 wherein the first and third passgate transistors are coupled to a first node, and the first node is coupled to a base node of the transistor output pullup through a passgate resistor to reduce capacitance at said base node.

8. An input buffer circuit constructed for delivering output signals of high and low potential levels at an output in response to data signals at a data signal input, bipolar transistor output pullup and output pulldown for sourcing and sinking current at the output, a bipolar input transistor coupled to the input, and a transistor phase splitter coupled to the bipolar transistor output pullup and pulldown, and to the bipolar input transistor, for controlling the respective conducting states of the bipolar transistor output pullup and pulldown in response to data signals at the input, comprising:

a CMOS passgate circuit coupled in the input buffer circuit between the bipolar input transistor and the bipolar transistor output pullup and pulldown, said CMOS passgate circuit having latch enable inputs for operating the input buffer circuit in transparent and blocking modes in response to latch enable signals at the latch enable inputs for respectively passing data signals from the data signal input to the output in the transparent mode and blocking data signals at the data signal input from propagating to the output in the blocking mode.

9. The BICMOS output buffer circuit of claim 8 wherein the CMOS passgate circuit is coupled to control nodes of the transistor output pullup and pulldown for controlling the conducting states of the respective transistor output pullup and pulldown to implement said blocking and transparent modes.

10. The BICMOS input buffer circuit of claim 9 wherein the passgate circuit comprises a first passgate transistor coupled between the high potential power rail and a control node of the output transistor pullup, said first passgate transistor having a control gate node coupled to a latch enable signal input, and a second passgate transistor coupled between a control node of the output transistor pulldown and low potential power rail, said second passgate transistor having a control gate node coupled to a latch enable signal input.

11. The BICMOS input buffer circuit of claim 10 wherein the CMOS passgate circuit comprises a third passgate transistor coupled between a control node of the output transistor pullup and the low potential power rail, said third passgate transistor having a control gate node coupled to a third latch enable input for controlling the conducting state of the third passgate transistor in opposite phase form the first passgate transistor.

12. The BICMOS input buffer circuit of claim 13 wherein the first and third passgate transistors are coupled to a first node, and the first node is coupled to a base node of the transistor output pullup through a passgate resistor to reduce capacitance at said base node.

13. The BICMOS input buffer circuit of claim 8 comprising:

a dynamic power enhancement circuit coupled to the input buffer circuit and CMOS passgate circuit said DPC being constructed to provide transient enhancement of base drive current to enhance transition form the blocking mode to transparent mode at the output of the BICMOS input buffer circuit; said DPC being coupled between a high potential power rail and the input transistor form transient enhancement of base drive current from the input transistor to the transistor phase splitter during a transition from the blocking mode to the transparent mode.

14. The BICMOS input buffer circuit of claim 13 wherein the dynamic power enhancement circuit comprises first and second DPC transistor with primary current paths coupled in series between the high potential power rail and a primary current path of the input transistor, said second DPC transistor having a control node coupled to a latch enable input, and said first DPC transistor having a control node coupled to the latch enable input through an inverting delay stage circuit for operating the first and second DPC transistors in opposite phase with a specified signal propagation delay between turn on of the second DPC transistor and turn off of the first DPC transistor.

15. The BICMOS input buffer circuit of claim 14 wherein the inverting delay stage circuit comprises a sequence of an odd number plurality of inverter stages coupled in series between the latch enable input and the control node of the first DPC transistor.

* * * * *